(12) United States Patent
Brokaw

(10) Patent No.: US 6,507,246 B1
(45) Date of Patent: Jan. 14, 2003

(54) FET CIRCUIT WITH RESISTOR-PROGRAMMABLE TRANSCONDUCTANCE

(75) Inventor: A. Paul Brokaw, Tucson, AZ (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/081,612

(22) Filed: Feb. 20, 2002

(51) Int. Cl.[7] .................................................. H03F 3/04
(52) U.S. Cl. ...................... 330/288; 330/285; 330/296; 330/297
(58) Field of Search ................................. 330/285, 288, 330/296, 297

(56) References Cited

U.S. PATENT DOCUMENTS

| | | | | |
|---|---|---|---|---|
| 4,389,619 A | * | 6/1983 | Limberg | 330/288 |
| 5,986,507 A | * | 11/1999 | Itakura et al. | 330/288 |
| 2002/0027476 A1 | * | 3/2002 | Soldavini | 330/288 |

FOREIGN PATENT DOCUMENTS

| | | | | |
|---|---|---|---|---|
| CH | 633661 | * | 12/1982 | 330/288 |

OTHER PUBLICATIONS

Kimura "Low Voltage Techniques for Bias Circuits" IEEE Transactions on Circuits and Systems I vol. 44 Issue 5, May 1997.*

Understanding Wide–Band MOS Transistors, Circuits and Devices, John M. Steininger, p. 26–31, date unknown.

Analog Integrated Circuit Design, Chapter 5, Basic Opamp Design and Compensation, David Johns, Ken Martin, p. 248–251 (1997) May 1997.

* cited by examiner

Primary Examiner—Michael B Shingleton
(74) Attorney, Agent, or Firm—Koppel, Jacobs, Patrick & Heybl

(57) ABSTRACT

A circuit is presented which sets the transconductance of a FET using a resistor. The circuit comprises a resistor and first and second FETs series-connected in sequence between a supply voltage and a circuit common point, and third and fourth FETs and a bias current source series-connected in sequence between the supply voltage and the circuit common point. The drain and gate of the fourth FET are connected to the gate of the second FET and the gates of the first and third FETs are cross-coupled to the drains of the third and first FETs, respectively. The bias current source provides a starting current for the circuit. When so arranged, and with the threshold voltages of the first and second FETs matched, the transconductance of the second FET is directly proportional to 1/R1. The circuit can in turn be used to bias other transistors in a reproducible way to fix the transconductance of an amplifier according to the selected resistor value.

10 Claims, 5 Drawing Sheets

FET CIRCUIT WITH RESISTOR-PROGRAMMABLE TRANSCONDUCTANCE

BACKGROUND OF THE INVENTION

1. Field of the Invention

This invention relates to the field of transconductance amplifiers, and particularly to methods of controlling the transconductance of MOS transistors.

2. Description of the Related Art

A useful element of electronic circuit design is the transconductance amplifier; i.e., a voltage-to-current amplifier having an associated transconductance $g_m$ (gain) which is expressed in units of A/V. Such amplifiers are constructed from transistors, which exhibit transconductance. However, the transconductance of a transistor is influenced by several factors which can adversely affect amplifier performance. For example, the transconductance of a MOS transistor depends on a number of factors, including transistor size, operating current, and temperature. These last two dependencies are subject to broad variations due to manufacturing tolerances, making it difficult to accurately set the transconductance and maintain it against temperature variation.

One approach to minimizing transconductance variation is described in "Understanding Wide-Band MOS Transistors", J. Steininger, IEEE Circuits and Devices, Vol. 6, No. 3, pp. 26–31 (May 1990). Steininger proposes a circuit which is a MOS version of a self-biasing Widlar current source, comprising two PMOS and two NMOS transistors (two of which are diode-connected) and a resistor $R_b$. When the transistors are properly sized, the transconductance becomes directly proportional to the resistance of $R_b$.

However, this circuit suffers from a couple of weaknesses. First, two of the circuit's transistors operate at zero gate-drain potential, while the other two do not. This subjects the second two transistors to the channel length modulation effect. Since these transistors experience the effects of variations in the supply voltage, their characteristics may be different than those of the first two transistors, and a biasing error may result.

A second problem is that the circuit has a second equilibrium state, when all currents are zero. Overcoming this "start-up" problem requires a start-up circuit, which typically introduces a small current into one of the diode-connected transistors. Unfortunately, this current inevitably corrupts the circuit by ensuring that one of the diode currents is larger than the other, which worsens the impact of the channel length modulation effect problem discussed above.

Another approach is described in Johns and Martin, "Analog Integrated Circuit Design", pp. 248–251 (1997). Here, a bias circuit is made from two PMOS and four NMOS transistors and a resistor. A cascading arrangement reduces the aforementioned channel length modulation effect somewhat, but not completely. In addition, the starting problem mentioned above also afflicts this circuit.

SUMMARY OF THE INVENTION

A FET circuit is presented which overcomes the problems noted above. The four-transistor circuit sets the transconductance of a FET using a resistor. The channel length modulation effect is practically eliminated, there is no starting problem, and all transistors are of like polarity.

The circuit comprises a resistor R1 and first and second FETs series-connected in sequence between a supply voltage and a circuit common point, and third and fourth FETs and a bias current source series-connected in sequence between the supply voltage and the circuit common point. The drain and gate of the fourth FET are connected to the gate of the second FET and the gates of the first and third FETs are cross-coupled to the drains of the third and first FETs, respectively. The bias current source provides a starting current for the circuit. All FETs are of like polarity.

When the circuit is arranged as described, and the threshold voltages of the first and second FETs are matched, the transconductance of the second FET is directly proportional to 1/R1. Since resistors can be made much more predictably than transistors, the invention makes the transconductance of the second FET much more robust against temperature change and manufacturing variability than it might be otherwise. The current and/or operating voltages of the FET can in turn be used to bias other FETs in a very reproducible way to fix the transconductance of an amplifier according to the selected resistor value.

Further features and advantages of the invention will be apparent to those skilled in the art from the following detailed description, taken together with the accompanying drawings.

DETAILED DESCRIPTION OF THE INVENTION

Figure 1:
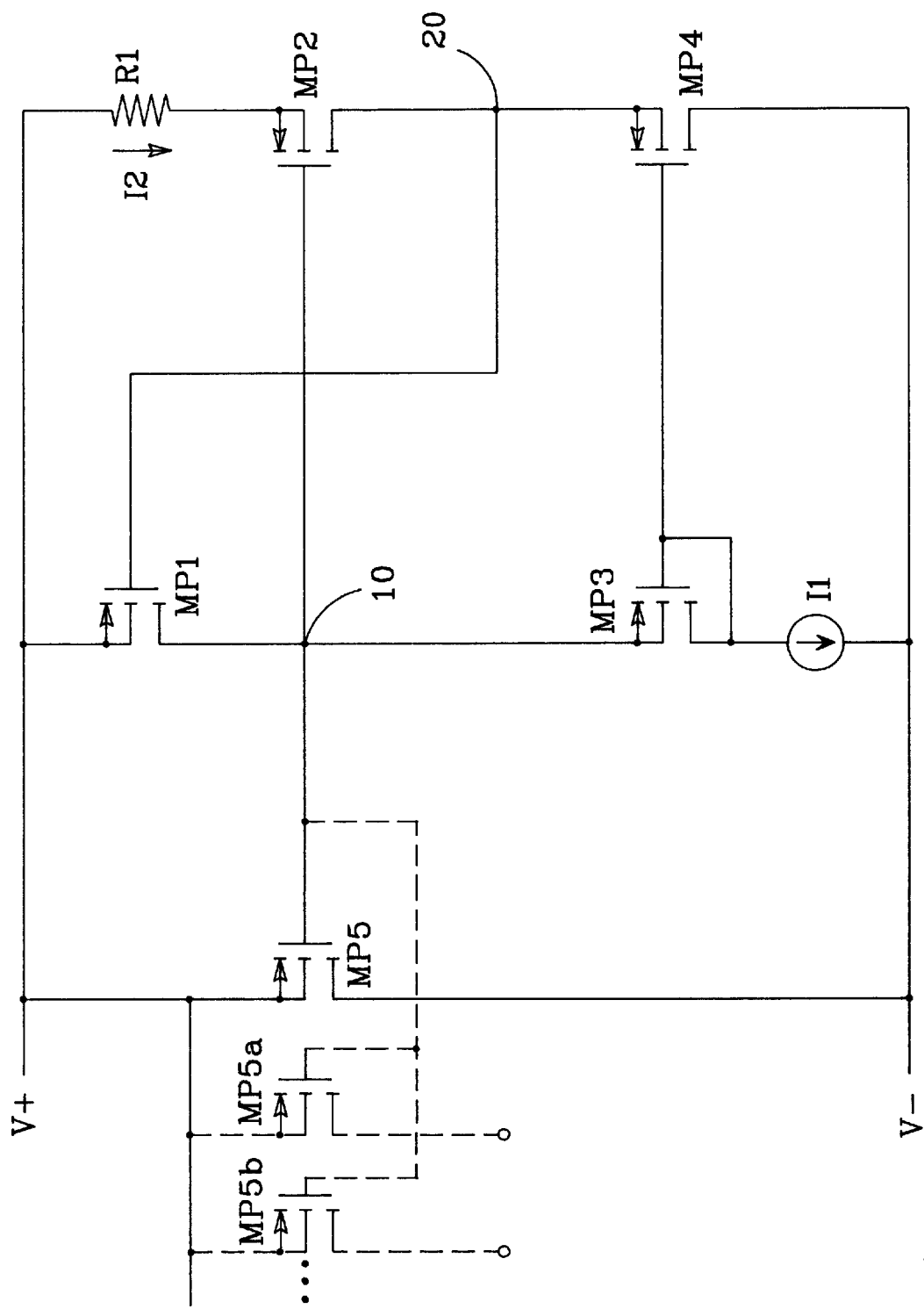
FIG. 1 is a schematic diagram of a FET circuit with resistor-programmable transconductance per the present invention.

An embodiment of a FET circuit with resistor-programmable transconductance per the present invention is shown in FIG. 1. The circuit includes a first FET MP1 connected between a supply voltage V+ and a node 10, a resistor R1 connected to V+ at one terminal, and a second FET MP2 connected between R1's second terminal and a node 20. A third FET MP3 is connected between node 10 and a bias current source I1, and a fourth FET MP4 is connected between node 20 and a circuit common point V−. The gates of MP1 and MP2 are cross-coupled to their opposite drains, such that MP1's gate is connected to node 20 and MP2's gate is connected to node 10. MP3 is diode-connected, and its gate/drain are connected to the gate of MP4.

It is seen by inspection that:

$$V_{gs1}+V_{gs4}=I2*R1+V_{gs2}+V_{gs3}$$

where $V_{gsx}$ is the gate-source voltage for FET MPx, and I2 is the current in R1. Since MP1 and MP3 are in series, each carries an equal current. If MP1 and MP3 are matched:

$$V_{gs1}=V_{gs3}$$

and therefore:

$$V_{gs4}-V_{gs2}=I2*R1.$$

If the threshold voltages are matched such that:

$$V_{t4}=V_{t2}=V_t,$$

where $V_{tx}$ is the threshold voltage of transistor MPx, then:

$$(V_{gs4}-V_t)-(V_{gs2}-V_t)=I2*R1.$$

Since MP1 and MP3 are in series with R1:

$$I2=ID2=ID4=ID,$$

where IDx is the drain current in transistor MPx.

$V_{gs}-V_t$ is given by:

$$V_{gs}-V_t = \sqrt{2*\frac{ID}{B}}$$

where B is the KP*W/L "beta" factor, with KP=$\mu C_{ox}$ and W/L being the FET's ratio of width to length.
Thus:

$$\sqrt{2*\frac{ID}{B4}} - \sqrt{2*\frac{ID}{B2}} = I2*R1,$$

where B4 and B2 are the beta factors of MP4 and MP2, respectively.

The transconductance $G_m$ of a FET is given by:

$$G_m=\sqrt{2*B*ID},$$

so, by substitution:

$$G_{m4} = \frac{2*\left[1-\sqrt{2*\frac{B4}{B2}}\right]}{R1} \quad \text{(Eq. 1)}$$

where $G_{m4}$ is the transconductance of FET MP4.

This means that the transconductance of MP4 is stabilized at a value which is directly proportional to 1/R1 and is a function of the ratio of the sizes of MP4 and MP2.

The transconductance of a transistor depends in part on its operating current. The configuration of the present FET circuit automatically forces an operating current (I2) to flow in MP4 which results in $G_{m4}$ being directly proportional to 1/R1. The operating current necessary to achieve this relationship may vary from FET to FET or from temperature to temperature, but the present circuit always forces the necessary MP4 operating current regardless.

This "resulting operating current" can be put into an identical transistor (i.e., made at the same time, on the same chip, and at the same temperature as MP4), which will then have the same transconductance as MP4. Alternatively, $G_{m4}$ can be scaled up or down by putting the resulting operating current into a FET having a known size ratio to MP4. The resulting operating current or a current derived from it could then be used to, for example, bias the FET transistors making up a differential input stage of an amplifier.

Rearranging one of the equations above gives:

$$(V_{gs2}-V_t)+I2*R1=(V_{gs4}-V_t)$$

That is, the voltage from V+ to node 10 is equal to the gate-source voltage of MP4. Thus, connecting the gate of a FET MP5 to node 10 and its source to V+ results in a drain current which is directly proportional to I2. Therefore, the node 10 voltage can be used to bias MP5, as well as other FETs MP5a, Mp5b, etc., connected in parallel with MP5, to provide respective currents equal to or a controlled multiple of I2.

Equation 1 is a correct expression for $G_{m4}$ when MP1 and MP3 are matched. However, it is not essential that MP1 and MP3 be matched. Even if MP1 and MP3 are not matched, $G_{m4}$ is still directly proportional to 1/R1; however, the size ratio between MP1 and MP3 will now appear in the expression for $G_{m4}$.

Figure 2:
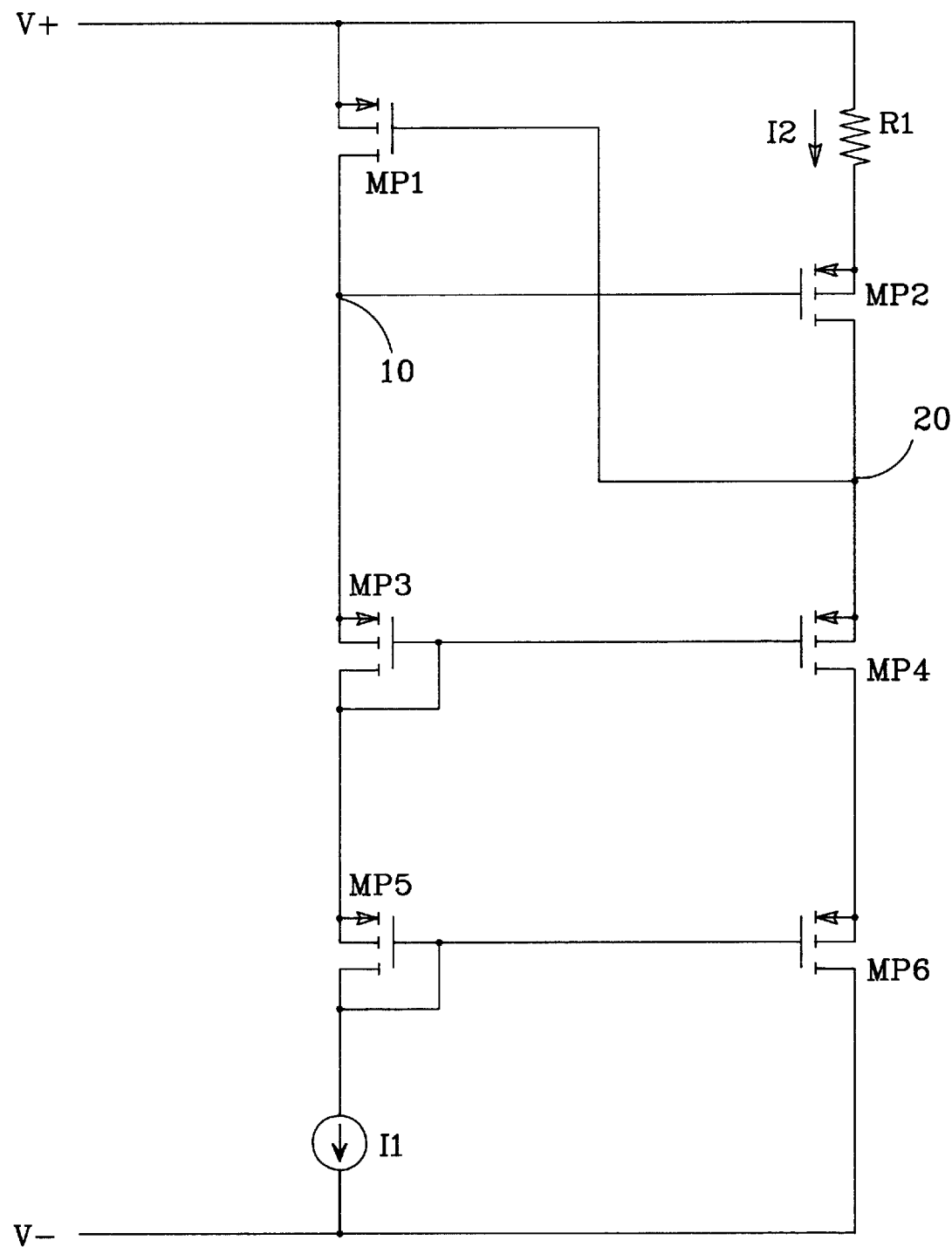
FIG. 2 is a schematic diagram of an alternative embodiment of a FET circuit with resistor-programmable transconductance per the present invention.

The drain-to-gate voltages of FETs MP1, MP2 and MP3 are shielded from the supply voltage, and therefore do not suffer from the channel length modulation effect discussed above. MP4, however, is not shielded, and thus supply voltage variations might adversely affect MP4's drain current-to-gate voltage relationship. One way in which this can be mitigated is with the use of a cascoding arrangement as shown in FIG. 2. Here, a diode-connected PMOS FET MP5 is connected between the drain of MP3 and I1, and a PMOS FET MP6 is connected between the drain of MP4 and circuit common, with the gates of MP5 and MP6 connected together. When so arranged, the drain-to-gate voltage of MP4 is given by the difference between $V_{gs5}$ and $V_{gs6}$. This voltage is much less than the supply voltage, and as a result, channel length modulation errors due to variations in supply voltage are greatly reduced. When so arranged, the "resulting operating current" used to bias another FET or circuit would be taken at the drain of MP6, rather than at MP4's drain as in FIG. 1.

Note that, though the schematics shown in FIGS. 1 and 2 show all the FETs being PMOS, the present circuit can also be realized with NMOS FETs. Each FET is preferably fabricated with an isolation well, which is connected to the FET's source to eliminate any body effect.

The circuit is started by bias current I1. The cross-coupled gates of MP1 and MP2 ensure that over a broad range, operating current I2 is essentially insensitive to the magnitude of the bias/start-up current. Thus, the present circuit can be started and run with almost any available current, which can even be allowed to vary while the circuit is in operation.

Figure 3:
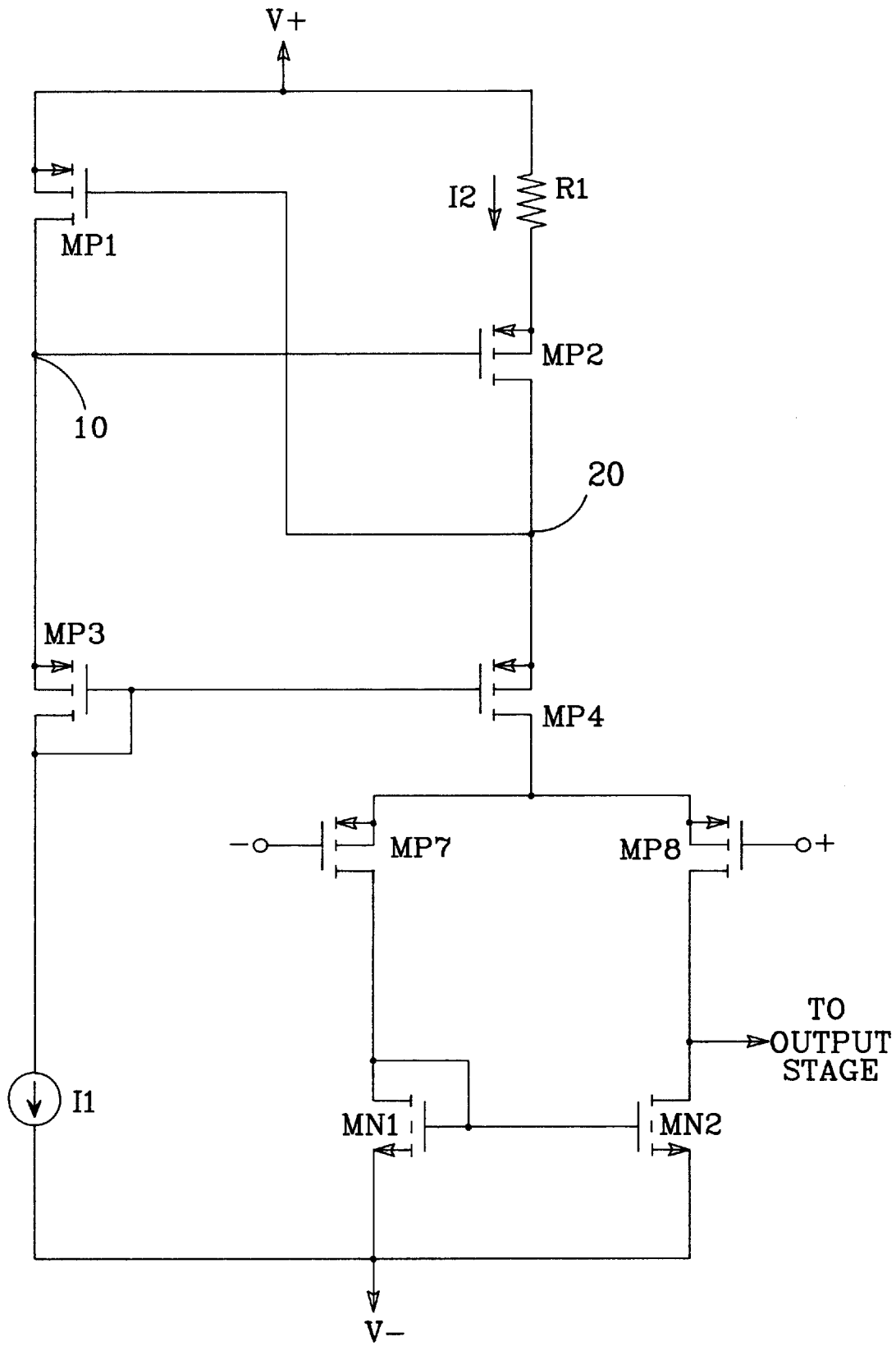
FIG. 3 is a schematic diagram illustrating a first method by which the present invention can be used to bias a differential input stage.

One application for the present FET circuit is shown in FIG. 3. Here, the circuit provides bias current to a FET differential input stage connected between MP4 and circuit common point V-. The input stage is made from PMOS FETs MP6 and MP7 connected as a differential pair, the outputs of which are combined using NMOS current mirror transistors MN1 and MN2 to produce a single-ended output which would typically be used to drive an output stage. The present circuit can be used to set the overall transconductance of the differential input stage. Assume, for example, that MP7 and MP8 are sized such that each has a W/L twice as large as that of MP4. Each of MP7 and MP8 receives half the current from MP4, so that when their respective outputs are combined by MN1 and MN2, the input stage will have the same overall $G_m$ as MP4—i.e., the $G_m$ for the input stage will be directly proportional to 1/R1. In this way, the transconductance of a differential input stage can be set to a desired value by simply properly sizing R1.

Figure 4:
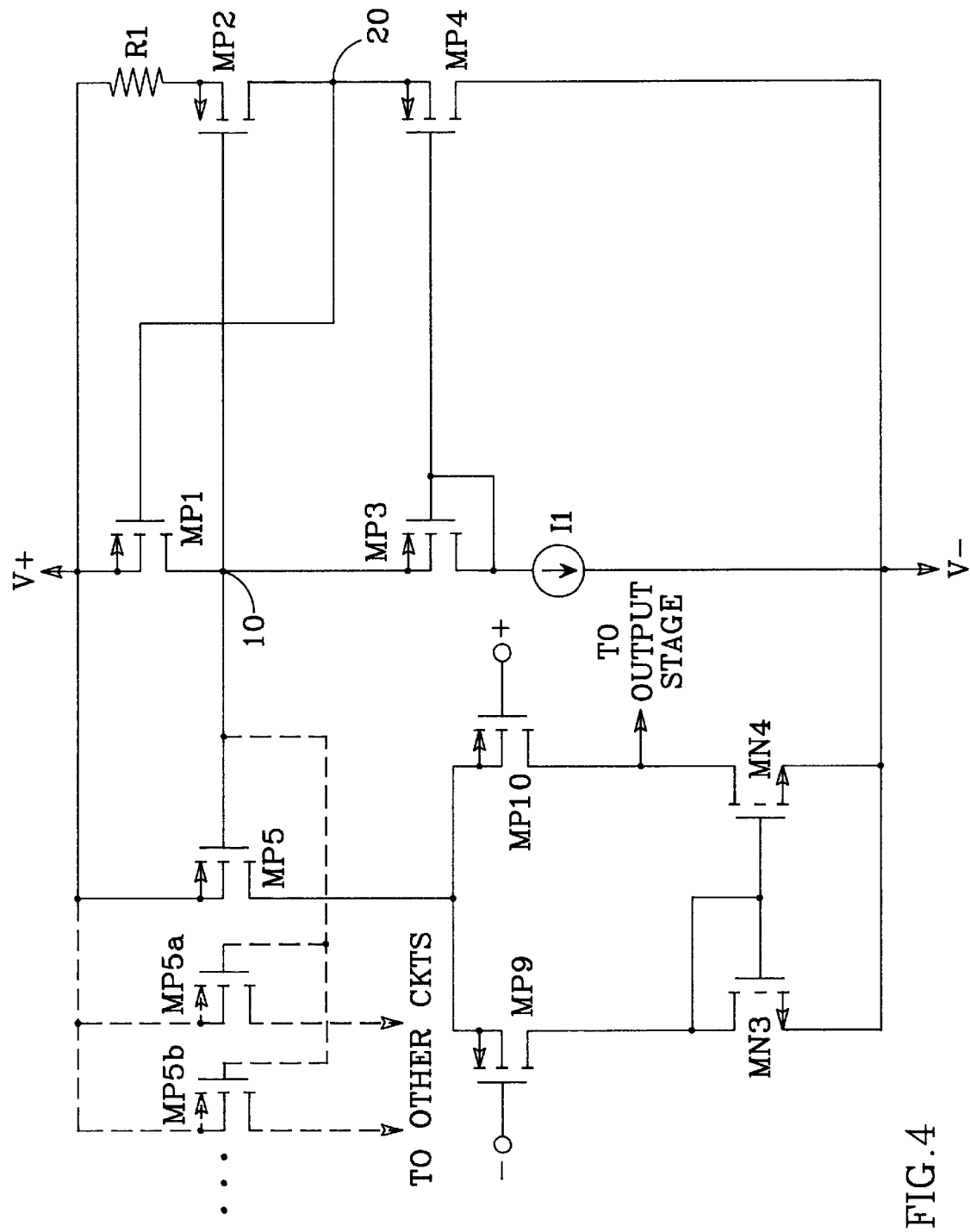
FIG. 4 is a schematic diagram illustrating another method by which the present invention can be used to bias a differential input stage, and/or additional circuitry.

Another method by which a differential input stage can be biased and its transconductance set to a desired value is shown in FIG. 4. Here, the gate of MP5 is connected to node 10, thereby producing a bias current which is directly proportional to I2. A differential input stage is connected between MP5 and V-, and is made from PMOS FETs MP9 and MP10, the outputs of which are combined using NMOS current mirror transistors MN3 and MN4 to produce a single-ended output. This arrangement also sets the transconductance of the differential input stage. Assume, for example, that MP5's W/L is twice that of MP4, and that the W/L of each of MP9 and MP10 is equal to that of MP4. When so arranged, the bias current delivered to the input stage by MP5 is equal to 2*I2, which is split by MP9 and MP10 such that each operates at nominally the same current as MP4. When the outputs of MP9 and MP10 are combined by MN3 and MN4, the differential input stage will have the same overall $G_m$ as MP4. The same result could be achieved by, for example, making MP5 the same size as MP4, and making MP9 and MP10 twice the size of MP4. In either case, the transconductance of the differential input stage is directly proportional to 1/R1. And, as noted above, additional circuits can be similarly biased by connecting additional PMOS FETs such as MP5a and MP5b in parallel with MP5.

Figure 5:
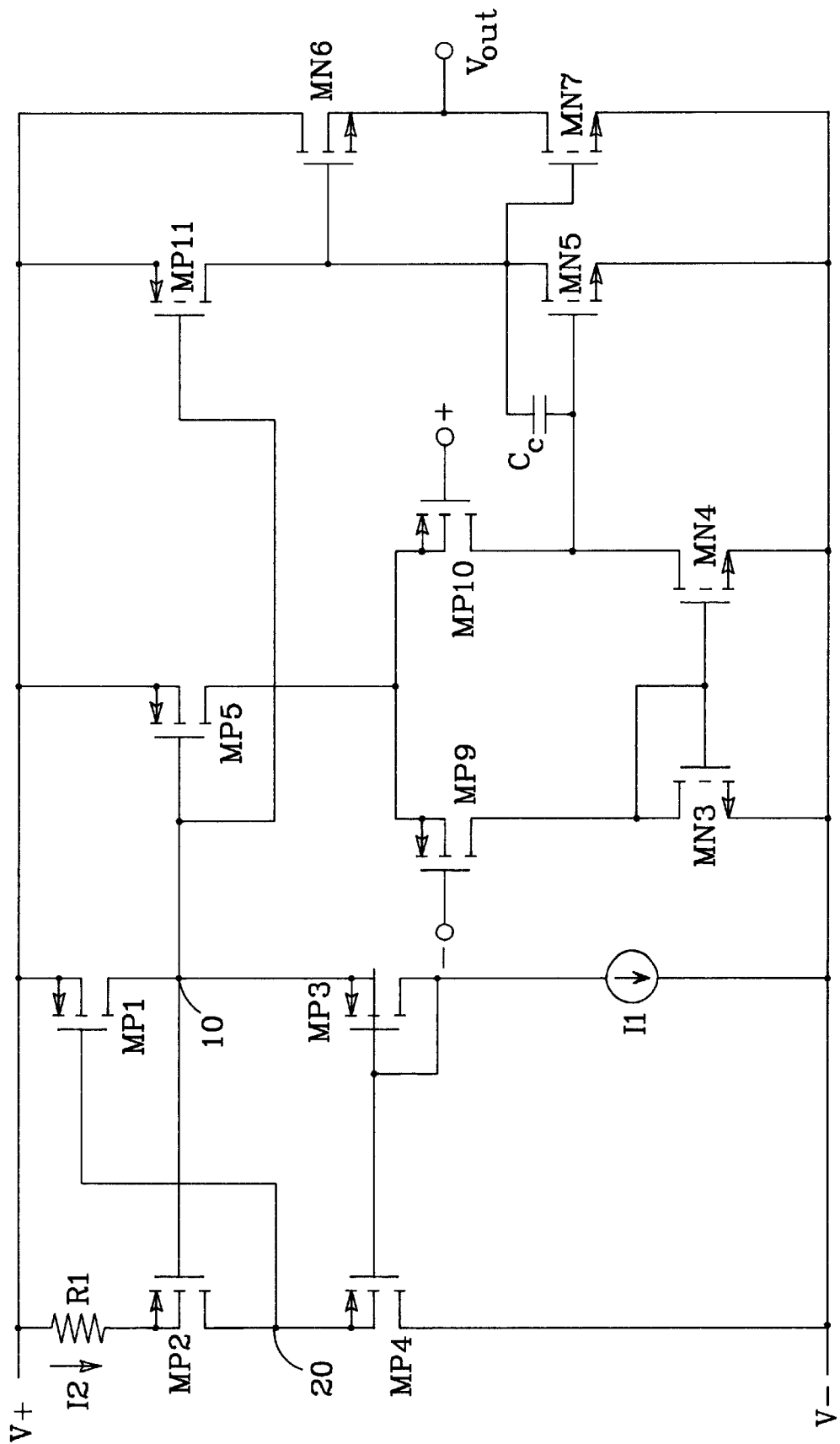
FIG. 5 is a schematic diagram illustrating a method by which the present invention can be used to bias the input and output stages of a differential amplifier.

Another application of the invention is shown in FIG. 5, which employs the present FET circuit to establish the $G_m$ of the differential input stage of an operational amplifier, which in turn serves to control the bandwidth and frequency stability of the op amp. Here, the present FET circuit is configured as in FIG. 4, with FET MP5 connected to node 10 to provide a bias current which varies with 1/R1 to the MP9/MP10 differential input stage. The output produced by the input stage is fed to the gate of a second stage NMOS FET MN5, which has a compensation capacitor $C_c$ connected between its gate and drain. The output of MN5 is fed to an output buffer made from a pair of NMOS FETs MN6 and MN7; the amplifier's output $V_{out}$ is taken at the junction of MN6 and MN7. A PMOS FET MP11 is connected in parallel with MP5 to provide a bias current which varies with 1/R1 to the second stage.

The unity gain bandwidth of an op amp as shown in FIG. 5 is set by the ratio of the input stage transconductance to compensation capacitance; i.e., the unity gain frequency $f_u$ is given by $g_m/2\pi C_c$. Thus, the invention enables the op amp's bandwidth and frequency stability to be easily set by properly selecting the device sizes and the resistance R1.

While particular embodiments of the invention have been shown and described, numerous variations and alternate embodiments will occur to those skilled in the art. Accordingly, it is intended that the invention be limited only in terms of the appended claims.

I claim:

1. A field-effect transistor (FET) circuit having a resistor-programmable transconductance, comprising:
   a resistance having a value R1,
   first and second FETs, said resistance and said first and second FETs series-connected in sequence between a supply voltage and a circuit common point,
   third and fourth FETs, and
   a bias current source,
   said third and fourth FETs and said bias current source series-connected in sequence between said supply voltage and said circuit common point,
   the drain and gate of said fourth FET connected to the gate of said second FET and the gates of said first and third FETs cross-coupled to the drains of said third and first FETs, respectively, said bias current source arranged to provide a starting current for said FET circuit,
   said first, second, third and fourth FETs being of a first polarity and the threshold voltages of said first and second FETs matched such that the transconductance $Gm_2$ of said second FET is directly proportional to 1/R1.

2. The FET circuit of claim 1, said third and fourth FETs connected together at a first node, further comprising a fifth FET having its gate connected to said first node and its source referred to said supply voltage such that said fifth FET conducts a current and has a transconductance which are directly proportional to the current in and the transconductance of said second FET, respectively.

3. The FET circuit of claim 1, wherein said third and fourth FETs are matched such that the transconductance $Gm_2$ of said second FET is given by:

$$Gm_2 = \frac{2*\left(1 - \sqrt{\frac{B2}{B1}}\right)}{R1}$$

wherein $$B2 = \mu C_{ox} * \frac{W_2}{L_2} \text{ and } B1 = \mu C_{ox} * \frac{W_1}{L_1},$$

where $W_2$ and $L_2$ are the width and length, respectively, of said second FET, $W_1$ and $L_1$ are the width and length, respectively, of said first FET, and $\mu$ and $C_{ox}$ are the channel mobility and oxide capacitance, respectively, for said second and first FETs.

4. A field-effect transistor (FET) circuit having a resistor-programmable transconductance, comprising:
   a resistance having a value R1,
   a first FET, said resistance connected between a supply voltage and said first FET's source,
   a second FET having its current circuit connected between said first FET and a circuit common point, said second FET's source connected to said first FET's drain at a first node,
   a third FET having its current circuit connected between said supply voltage and a second node and its gate connected to said first node, the gate of said first FET connected to said second node,
   a fourth FET which has its source connected to said second node and its gate and drain connected to the gate of said second FET, and
   a bias current source connected between said fourth FET's drain and said circuit common point which provides a starting current for said FET circuit that forces a current I1 to flow in said resistance and said first and second FETs,
   said first, second, third and fourth FETs being of a first polarity and the threshold voltages of said first and second FETs matched such that said current I1 gives a transconductance $Gm_2$ for said second FET which is directly proportional to 1/R1.

5. The FET circuit of claim 4, wherein said third and fourth FETs are matched such that the transconductance $Gm_2$ of said second FET is given by:

$$Gm_2 = \frac{2*\left(1 - \sqrt{\frac{B2}{B1}}\right)}{R1}$$

wherein $$B2 = \mu C_{ox} * \frac{W_2}{L_2} \text{ and } B1 = \mu C_{ox} * \frac{W_1}{L_1},$$

where $W_2$ and $L_2$ are the width and length, respectively, of said second FET, $W_1$ and $L_1$ are the width and length, respectively, of said first FET, and $\mu$ and $C_{ox}$ are the channel mobility and oxide capacitance, respectively, for said second and first FETs.

6. The FET circuit of claim 4, further comprising fifth and sixth FETs of said first polarity, said fifth FET connected in series between said second FET and said circuit common point and said sixth FET connected in series between said fourth FET and said bias current source, the drain and gate of said sixth FET connected to the gate of said fifth FET.

7. The FET circuit of claim 4, further comprising a FET differential input stage, said input stage connected between said second FET and said circuit common point such that said input stage is biased with current I1 and the transconductance of said input stage is directly proportional to the transconductance of said second FET.

8. The FET circuit of claim 4, further comprising a fifth FET having its gate connected to said second node and its source referred to said supply voltage such that said fifth FET conducts a current and has a transconductance which are directly proportional to the current in and the transconductance of said second FET, respectively.

9. The FET circuit of claim 8, further comprising a FET differential input stage, said input stage connected to said fifth FET such that said input stage is biased with said current conducted by said fifth FET and the transconductance of said input stage is directly proportional to the transconductance of said second FET.

10. A field-effect transistor (FET) operational amplifier having a resistor-programmable bandwidth, said amplifier comprising:
    a FET circuit with resistor-programmable transconductance, comprising:
        a resistance having a value R1,
        a first FET, said resistance connected between a supply voltage and said first FET's source,
        a second FET having its current circuit connected between said first FET and a circuit common point, said second FET's source connected to said first FET's drain at a first node,
        a third FET having its current circuit connected between said supply voltage and a second node and its gate connected to said first node, the gate of said first FET connected to said second node,
        a fourth FET which has its source connected to said second node and its gate and drain connected to the gate of said second FET, and
        a bias current source connected between said fourth FET's drain and said circuit common point which provides a starting current for said FET circuit that forces a current I1 to flow in said resistance and said first and second FETs,
        said first, second, third and fourth FETs being of a first polarity and the threshold voltages of said first and second FETs matched such that said current I1 gives a transconductance $Gm_2$ for said second FET which is directly proportional to 1/R1;
    a fifth FET having its gate connected to said second node and its source referred to said supply voltage such that said fifth FET conducts a current and has a transconductance which are directly proportional to the current in and the transconductance of said second FET, respectively;
    a FET differential input stage comprising a FET differential pair and a current mirror connected to said differential pair to produce a single-ended output, said input stage connected to said fifth FET such that said differential pair is biased with said current conducted by said fifth FET and the transconductance of said input stage is directly proportional to the transconductance of said second FET;
    a sixth FET having its gate connected to said second node and its source referred to said supply voltage such that said sixth FET conducts a current and has a transconductance which are directly proportional to the current in and the transconductance of said second FET, respectively;
    a FET second stage which is biased with said current conducted by said sixth FET, said second stage comprising a seventh FET connected to conduct a current which varies with said single-ended output and a compensation capacitor having a capacitance $C_c$ connected between said seventh FET's gate and source;
    said operational amplifier arranged such that its unity gain frequency $f_u$ is given by $g_m/2\pi C_c$, where $g_m$ is the transconductance of said input stage, said FET circuit with resistor-programmable transconductance and said fifth and sixth FETs arranged such that $f_u$ is directly proportional to 1/R1.

* * * * *